United States Patent
Secatch et al.

(10) Patent No.: US 11,016,679 B2
(45) Date of Patent: May 25, 2021

(54) BALANCED DIE SET EXECUTION IN A DATA STORAGE SYSTEM

(71) Applicant: Seagate Technology LLC, Cupertino, CA (US)

(72) Inventors: Stacey Secatch, Niwot, CO (US); David W. Claude, Loveland, CO (US)

(73) Assignee: Seagate Technology LLC, Fremont, CA (US)

(*) Notice: Subject to any disclaimer, the term of this patent is extended or adjusted under 35 U.S.C. 154(b) by 35 days.

(21) Appl. No.: 16/023,420

(22) Filed: Jun. 29, 2018

(65) Prior Publication Data

US 2020/0004443 A1 Jan. 2, 2020

(51) Int. Cl.
*G06F 3/06* (2006.01)
*G11C 5/02* (2006.01)
*G06F 11/34* (2006.01)
*G06F 9/48* (2006.01)
*G11C 11/4093* (2006.01)
*G11C 8/12* (2006.01)

(52) U.S. Cl.
CPC .......... *G06F 3/0629* (2013.01); *G06F 3/061* (2013.01); *G06F 3/0659* (2013.01); *G06F 3/0679* (2013.01); *G06F 3/0683* (2013.01); *G06F 9/4881* (2013.01); *G06F 11/3409* (2013.01); *G11C 5/025* (2013.01); *G11C 8/12* (2013.01); *G11C 11/4093* (2013.01)

(58) Field of Classification Search
CPC ...... G06F 3/06–0689; G06F 2003/0691–0698; G06F 3/061–0613; G06F 3/0659; G06F 9/3855; G06F 12/00–16; G06F 13/1642; G06F 12/0246–0276; G06F 2212/72–7211
See application file for complete search history.

(56) References Cited

U.S. PATENT DOCUMENTS

| | | | |
|---|---|---|---|
| 6,401,120 B1 | 6/2002 | Gamache et al. | |
| 6,507,183 B1* | 1/2003 | Mulatti et al. | G11C 16/30 324/99 D |
| 8,046,558 B2 | 10/2011 | Ghose | |
| 8,233,303 B2 | 7/2012 | Best et al. | |
| 8,238,911 B2 | 8/2012 | D'Amore et al. | |
| 9,262,163 B2 | 2/2016 | Kurts et al. | |
| 9,449,018 B1 | 9/2016 | Ma et al. | |
| 9,626,274 B2 | 4/2017 | Yasin et al. | |
| 10,387,340 B1* | 8/2019 | Baryudin | G06F 3/064 |
| 2016/0357474 A1* | 12/2016 | Frid | G06F 3/0634 |
| 2018/0165016 A1* | 6/2018 | Malina et al. | G06F 3/0652 |
| 2018/0188970 A1* | 7/2018 | Liu | G06F 3/0611 |
| 2019/0114276 A1* | 4/2019 | Hodes | G06F 13/385 |
| 2019/0332320 A1* | 10/2019 | Wu | G06F 3/0604 |

* cited by examiner

*Primary Examiner* — Nicholas J Simonetti
(74) *Attorney, Agent, or Firm* — Hall Estill Attorneys at Law

(57) ABSTRACT

A data storage system can arrange semiconductor memory into a plurality of die sets where performance metrics of execution of a first data access command to a first die set and of a second data access command to a second die set are measured. A proactive strategy is generated to maintain consistent data access command execution performance with a quality of service module based on the measured performance metrics and a third data access command is altered, as directed by the proactive strategy, to prevent a predicted non-uniformity of data access command performance between the first die set and the second die set.

20 Claims, 8 Drawing Sheets

BALANCED DIE SET EXECUTION IN A DATA STORAGE SYSTEM

SUMMARY

Various embodiments of the present disclosure are generally directed to the management of operations in a memory, such as, but not limited to, a flash memory in a solid state drive (SSD).

In accordance with some embodiments, a data storage semiconductor memory has a semiconductor memory divided into a plurality of die sets where performance metrics of execution of a first data access command to a first die set and of a second data access command to a second die set are measured. A proactive strategy is generated to maintain consistent data access command execution performance with a quality of service module based on the measured performance metrics and a third data access command is altered, as directed by the proactive strategy, to prevent a predicted non-uniformity of data access command performance between the first die set and the second die set.

Performance metrics are measured, in other embodiments, for a first data access command to a first die set of a semiconductor memory and for a second data access command to a second die set of the semiconductor memory. A proactive strategy is generated to maintain consistent data access command execution performance with a quality of service module based on the measured performance metrics. A reactive strategy is generated to maintain consistent data access command execution performance with the quality of service module based on detection of an unpredicted event. At least a third data access command is altered, as directed by the proactive strategy, to prevent a predicted non-uniformity of data access command performance between the first die set and the second die set.

In another embodiment, a data storage system a quality of service module is connected to a first die set and a second die set of a semiconductor memory with the quality of service module configured to measure performance metrics of execution of a first data access command to the first die set and of a second data access command to a second die set. A prediction circuit of the quality of service module generates a proactive strategy to maintain consistent data access command execution performance with a quality of service module based on the measured performance metrics and a scheduler circuit of the quality of service module is configured to alter a third data access command, as directed by the proactive strategy, to prevent a predicted non-uniformity of data access command performance between the first die set and the second die set.

These and other features which may characterize various embodiments can be understood in view of the following detailed discussion and the accompanying drawings.

DETAILED DESCRIPTION

Figure 1:
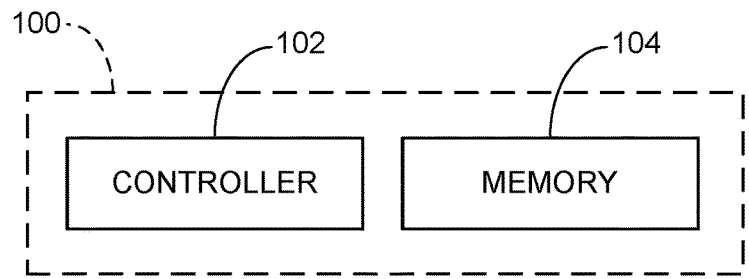
FIG. 1 provides a functional block representation of a data storage device in accordance with various embodiments.

Without limitation, the various embodiments disclosed herein are generally directed to managing data access and data maintenance operations in one or more data storage devices of a data storage system to provide balanced data access operation execution.

Solid state drives (SSDs) are data storage devices that store user data in non-volatile memory (NVM) made up of an array of solid-state semiconductor memory cells. SSDs usually have an NVM module and a controller. The controller controls the transfer of data between the NVM and a host device. The NVM will usually be NAND flash memory, but other forms of solid-state memory can be used.

A flash memory module may be arranged as a series of dies. A die represents a separate, physical block of semiconductor memory cells. The controller communicates with the dies using a number of channels, or lanes, with each channel connected to a different subset of the dies. Any respective numbers of channels and dies can be used. Groups of dies may be arranged into die sets, which may correspond with the NVMe (Non-Volatile Memory Express) Standard. This standard enables multiple owners (users) to access and control separate portions of a given SSD (or other memory device).

Metadata is often generated and used to describe and control the data stored to an SSD. The metadata may take the form of one or more map structures that track the locations of data blocks written to various GCUs (garbage collection units), which are sets of erasure blocks that are erased and allocated as a unit. The map structures can include a forward map and a reverse directory, although other forms can be used.

The forward map provides an overall map structure that can be accessed by a controller to service a received host access command (e.g., a write command, a read command, etc). The forward map may take the form of a two-level map, where a first level of the map maintains the locations of map pages and a second level of the map provides a flash transition layer (FTL) to provide association of logical addresses of the data blocks to physical addresses at which the blocks are stored. Other forms of maps can be used including single level maps and three-or-more level maps, but each generally provides a forward map structure in which pointers may be used to point to each successive block until the most current version is located.

The reverse directory can be written to the various GCUs and provides local data identifying, by logical address, which data blocks are stored in the associated GCU. The reverse directory, also sometimes referred to as a footer, thus provides a physical to logical association for the locally stored blocks. As with the forward map, the reverse directory can take any number of suitable forms. Reverse directories are particularly useful during garbage collection operations, since a reverse directory can be used to determine which data blocks are still current and should be relocated before the associated erasure blocks in the GCU are erased.

SSDs expend a significant amount of resources on maintaining accurate and up-to-date map structures. Nevertheless, it is possible from time to time to have a mismatch between the forward map and the reverse directory for a given GCU. These situations are usually noted at the time of garbage collection. For example, the forward map may indicate that there are X valid data blocks in a given erasure block (EB), but the reverse directory identifies a different number Y valid blocks in the EB. When this type of mismatch occurs, the garbage collection operation may be rescheduled or may take a longer period of time to complete while the system obtains a correct count before proceeding with the recycling operation.

The NVMe specification provides that a storage device should have the ability to provide guaranteed levels of deterministic performance for specified periods of time (deterministic windows, or DWs). To the extent that a garbage collection operation is scheduled during a DW, it is desirable to ensure that the actual time that the garbage collection operation would require to complete is an accurate estimate in order for the system to decide whether and when to carry out the GC operation.

SSDs include a top level controller circuit and a flash (or other semiconductor) memory module. A number of channels, or lanes, are provided to enable communications between the controller and dies within the flash memory. The dies are further subdivided into planes, GCUs, erasure blocks, pages, etc. Groups of dies may be arranged into separate die sets, or namespaces. This allows the various die sets to be concurrently serviced for different owners (users). A data storage device generally carries out three (3) main operations: (1) hot data transfers during which user data sets are written to or read from the flash memory; (2) cold data transfers during which the device carries out garbage collection and other operations to free up memory for the storage of new data; and (3) map updates in which snapshots and journals are accumulated and written to maintain an up-to-date system map of the memory locations in which data sets are stored.

A data storage device can periodically enter a deterministic window (DW) during which certain operational performance is guaranteed, such as guaranteed data delivery without retransmission. The specification is not clear on exactly how long the DW is required to last, or by what metrics the device can be measured. One example of a DW performance is that X number of reads can be carried out at a certain minimum data transfer rate; another is that so many blocks may be written to completion within a particular period of time. It is contemplated that a user can declare a DW at substantially any given time, and it is not usually known when a DW will be declared. There is a non-deterministic window (NDW) that will occur after each DW to allow the device to recover and carry out background operations, etc.

A number of channels, or lanes, may be provided in a data storage system to enable communications between one or more controllers and dies within the flash memory. The operating capacity of flash memory can be divided among a number of die sets, with each die set controlled by a different owner/user/host. Based on the configuration of a data storage system, such as virtual machines or app containers, many different users/owners/hosts can be concurrently access a given SSD and generate data access (e.g. read, write etc.) commands, such as data reads, data writes, and background operations.

A problem arises when different owners/users/hosts of a data storage system experience different levels of service, such as data access latency, error rate, or overall command execution time. This can become more difficult as the SSD approaches full capacity, in which the risk of write amplification is amplified and overprovisioning may become decreased. In a data storage system with limited number of resources, such as available local memory (e.g., DRAM, buffers, etc.), power budget, and processing, operation management is emphasized in order to maintain adequate performance for all users/owners.

Accordingly, embodiments are directed to optimizing I/O by keeping a running estimation of allocated work per resource, such as how much time it takes to perform a write, a read, etc., to choose which work task to perform next in order to balance data access execution performance across all owners/hosts in a data storage system. Generally, embodiments maintain estimates of time required to perform certain tasks, and deciding whether we can do something else within a given time slot. Such considerations can be customized to DW intervals so that data access commands and/or background tasks are executed based on reliable estimations of how long execution will take, which can optimize the data read performance consistency during a DW interval.

Reliable prediction of how long a task will take to execute may involve gathering and maintaining background metrics on actual tasks that have been performed. The collected execution data can be placed into buckets or other groupings based on different scenarios, such as high, medium, or low utilization times. From this, a data storage system can estimate how much time a given task can realistically take, and schedules tasks, and/or alter task priority, as needed to obtain optimum throughput for all owners. Minimum rates of I/O can be established for certain NDW and DW intervals with priority given as required to ensure the data storage system provides consistent performance to each connected host.

In some embodiments, data storage system performance is balanced among die sets by allocating additional power and buffer resources to specific die sets when write amplification conditions have increased through loss of capacity and/or overprovisioning. By sacrificing performance for other die sets to equalize performance across all die sets, data accesses can be balanced to provide reliable and predictable performance to multiple different hosts/owners.

Monitoring utilization of each of the various die sets in a data storage device allows for comparison to the overall storage capacity of the system, overprovisioning configuration, and write amplification frequency to optimize system performance. When die set utilization reaches a specific level, such as a particular capacity is reached or when a power threshold is close, a data storage system can switch to one or more of the die sets, which gives priority to the die set in order to balance out overall system performance.

It is noted that balancing data access execution across different die sets may be counter-intuitive compared to providing maximum data access performance when available and promoting activities for lesser utilized sets than greater utilized sets, but the goal is to meet a consistent quality of service for every user/host rather than maximizing performance. As such, a data storage system could be penalized for providing too fast a data access execution time inconsistently to one or more owners/hosts instead of consistency for all user/hosts. The ability to adapt data storage system configuration and execution of data accesses, particularly when the available amount of overprovisioning decreases as data capacity reaches full, data access requests can be managed to maintain consistency among users/hosts despite dynamic operating conditions These and other features may be practiced in a variety of different data storage devices, but various embodiments conduct wear range optimization in the example data storage device 100 shown as a simplified block representation in FIG. 1. The device 100 has a controller 102 and a memory module 104. The controller block 102 represents a hardware-based and/or programmable processor-based circuit configured to provide top level communication and control functions. The memory module 104 includes solid state non-volatile memory (NVM) for the storage of user data from one or more host devices 106, such as other data storage devices, network server, network node, or remote controller.

Figure 2:
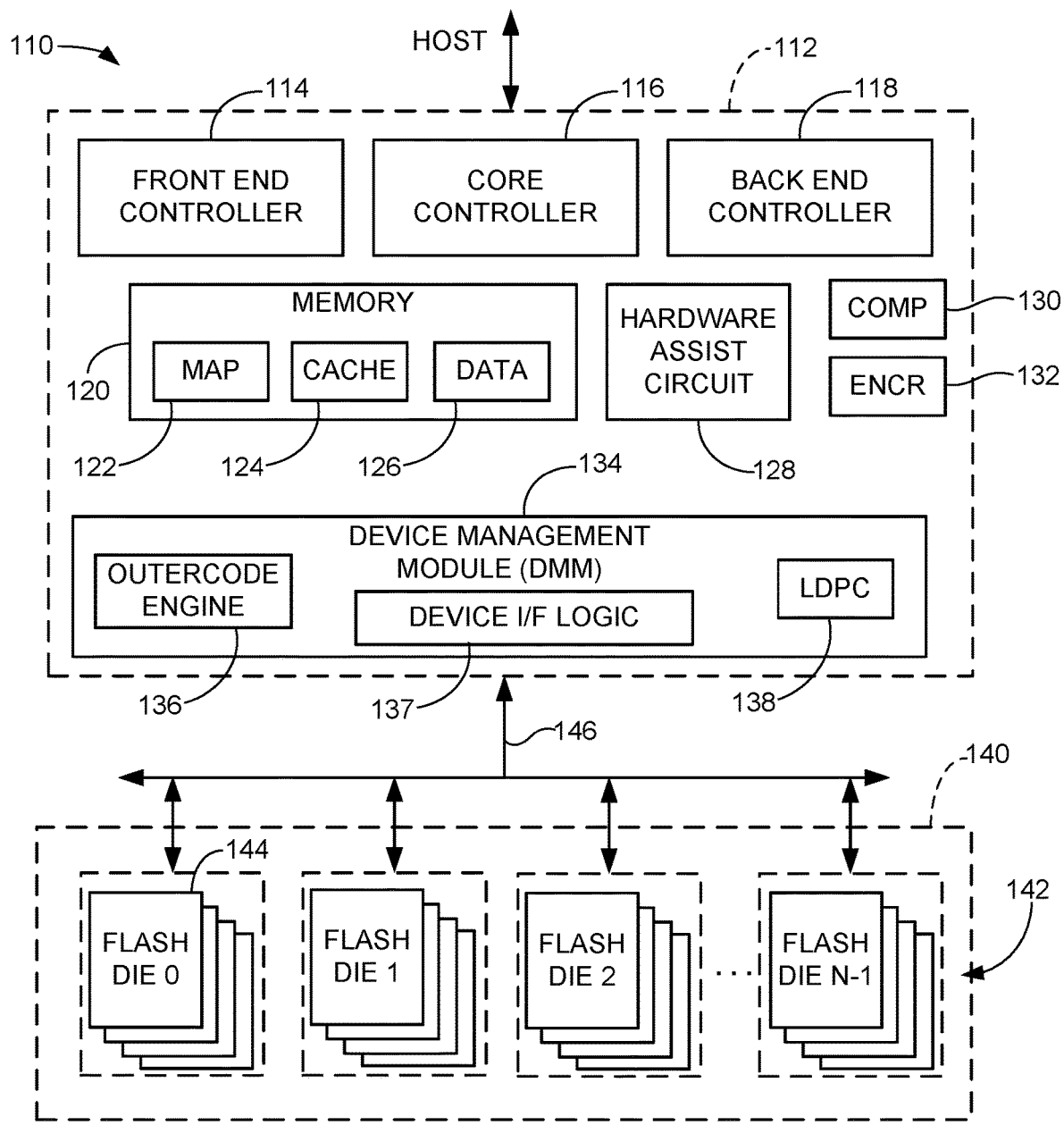
FIG. 2 shows aspects of the device of FIG. 1 characterized as a solid state drive (SSD) in accordance with some embodiments.

FIG. 2 displays an example data storage device 110 generally corresponding to the device 100 in FIG. 1. The device 110 is configured as a solid state drive (SSD) that communicates with one or more host devices via one or more Peripheral Component Interface Express (PCIe) ports, although other configurations can be used. The NVM is contemplated as comprising NAND flash memory, although other forms of solid state non-volatile memory can be used.

In at least some embodiments, the SS D operates in accordance with the NVMe (Non-Volatile Memory Express) Standard, which enables different users to allocate die sets for use in the storage of data. Each die set may form a portion of a Namespace that may span multiple SSDs or be contained within a single SSD.

The SSD 110 includes a controller circuit 112 with a front end controller 114, a core controller 116 and a back end controller 118. The front end controller 114 performs host I/F functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can also be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers.

A non-processor based hardware assist circuit 128 may enable the offloading of certain memory management tasks by one or more of the controllers as required. The hardware circuit 128 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in hardware and/or firmware in the controller 112, such as a data compression block 130 and an encryption block 132. The data compression block 130 applies lossless data compression to input data sets during write operations, and subsequently provides data de-compression during read operations. The encryption block 132 provides any number of cryptographic functions to input data including encryption, hashes, decompression, etc.

A device management module (DMM) 134 supports back end processing operations and may include an outer code engine circuit 136 to generate outer code, a device I/F logic circuit 137 and a low density parity check (LDPC) circuit 138 configured to generate LDPC codes as part of the error detection and correction strategy used to protect the data stored by the by the SSD 110.

A memory module 140 corresponds to the memory 104 in FIG. 1 and includes a non-volatile memory (NVM) in the form of a flash memory 142 distributed across a plural number N of flash memory dies 144. Rudimentary flash memory control electronics (not separately shown in FIG. 2) may be provisioned on each die 144 to facilitate parallel data transfer operations via one or more channels (lanes) 146.

Figure 3:
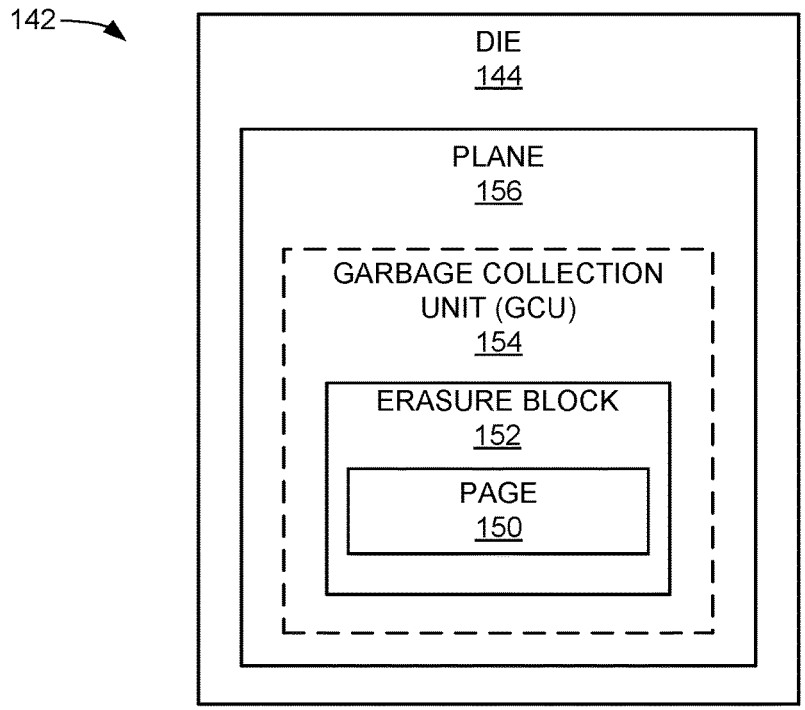
FIG. 3 is an arrangement of the flash memory of FIG. 2 in some embodiments.

FIG. 3 shows an arrangement of the various flash memory dies 144 in the flash memory 142 of FIG. 2 in some embodiments. Other configurations can be used. The smallest unit of memory that can be accessed at a time is referred to as a page 150. A page may be formed using a number of flash memory cells that share a common word line. The storage size of a page can vary; current generation flash memory pages can store, in some cases, 16 KB (16,384 bytes) of user data.

The memory cells 148 associated with a number of pages are integrated into an erasure block 152, which represents the smallest grouping of memory cells that can be concurrently erased in a NAND flash memory. A number of erasure blocks 152 are turn incorporated into a garbage collection unit (GCU) 154, which are logical structures that utilize erasure blocks that are selected from different dies. GCUs are allocated and erased as a unit. In some embodiments, a GCU may be formed by selecting one or more erasure blocks from each of a population of dies so that the GCU spans the population of dies.

Each die 144 may include a plurality of planes 156. Examples include two planes per die, four planes per die, etc. although other arrangements can be used. Generally, a plane is a subdivision of the die 144 arranged with separate read/write/erase circuitry such that a given type of access operation (such as a write operation, etc.) can be carried out simultaneously by each of the planes to a common page address within the respective planes.

Figure 4:
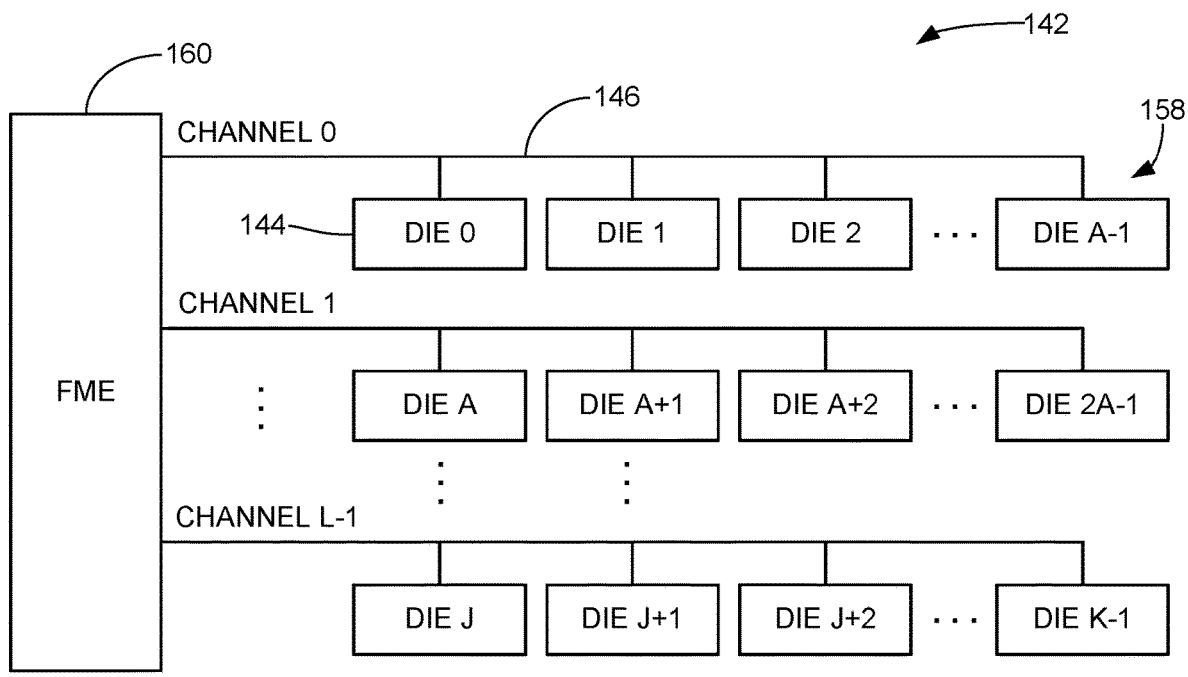
FIG. 4 illustrates the use of channels to access the dies in FIG. 3 in some embodiments.

FIG. 4 shows further aspects of the flash memory 142 in some embodiments. A total number K dies 144 are provided and arranged into physical die groups 158. Each die group 158 is connected to a separate channel 146 using a total number of L channels. In one example, K is set to 128 dies, L is set to 8 channels, and each physical die group has 16 dies. As noted above, a single die within each physical die group can be accessed at a time using the associated channel. A flash memory electronics (FME) circuit 160 of the flash memory module 142 controls each of the channels 146 to transfer data to and from the dies 144.

In some embodiments, the various dies are arranged into one or more die sets. A die set represents a portion of the storage capacity of the SSD that is allocated for use by a particular host (user/owner). die sets are usually established with a granularity at the die level, so that some percentage of the total available dies 144 will be allocated for incorporation into a given die set.

A first example die set is denoted at 162 in FIG. 4. This first set 162 uses a single die 144 from each of the different channels 146. This arrangement provides fast performance during the servicing of data transfer commands for the set since all eight channels 146 are used to transfer the associated data. A limitation with this approach is that if the set 162 is being serviced, no other die sets can be serviced during that time interval. While the set 162 only uses a single die from each channel, the set could also be configured to use multiple dies from each channel, such as 16 dies/channel, 32 dies/channel, etc.

A second example die set is denoted at 164 in FIG. 4. This set uses dies 144 from less than all of the available channels 146. This arrangement provides relatively slower overall performance during data transfers as compared to the set 162, since for a given size of data transfer, the data will be transferred using fewer channels. However, this arrangement advantageously allows the SSD to service multiple die sets at the same time, provided the sets do not share the same (e.g., an overlapping) channel 146.

Figure 5:
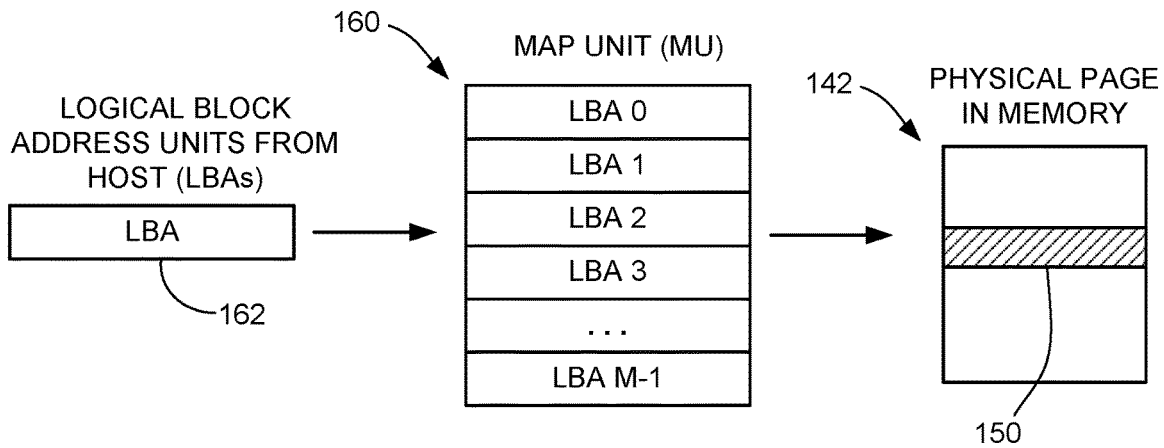
FIG. 5 represents a map unit (MU) as a data arrangement stored to the flash memory of FIG. 2.

FIG. 5 illustrates a manner in which data may be stored to the flash memory module 142. Map units (MUs) 170 represent fixed sized blocks of data that are made up of one or more user logical block address units (LBAs) 172 supplied by the host. Without limitation, the LBAs 172 may have a first nominal size, such as 512 bytes (B), 1024 B (1 KB), etc., and the MUs 170 may have a second nominal size, such as 4096 B (4 KB), etc. The application of data compression may cause each MU to have a smaller size in terms of actual bits written to the flash memory 142.

The MUs 170 are arranged into the aforementioned pages 150 (FIG. 3) which are written to the memory 142. In the present example, using an MU size of 4 KB, then nominally four (4) MUs may be written to each page. Other configurations can be used. To enhance data density, multiple pages worth of data may be written to the same flash memory cells connected to a common control line (e.g., word line) using multi-bit writing techniques; MLCs (multi-level cells) write two bits per cell, TLCs (three-level cells) write three bits per cell; XLCs (four level cells) write four bits per cell, etc.

Data stored by an SSD are often managed using metadata. The metadata provide map structures to track the locations of various data blocks (e.g., MUAs 170) to enable the SSD 110 to locate the physical location of existing data. For example, during the servicing of a read command it is generally necessary to locate the physical address within the flash memory 144 at which the most current version of a requested block (e.g., LBA) is stored, so that the controller can schedule and execute a read operation to return the requested data to the host. During the servicing of a write command, new data are written to a new location, but it is still necessary to locate the previous data blocks sharing the same logical address as the newly written block so that the metadata can be updated to mark the previous version of the block as stale and to provide a forward pointer or other information to indicate the new location for the most current version of the data block.

Figure 6:
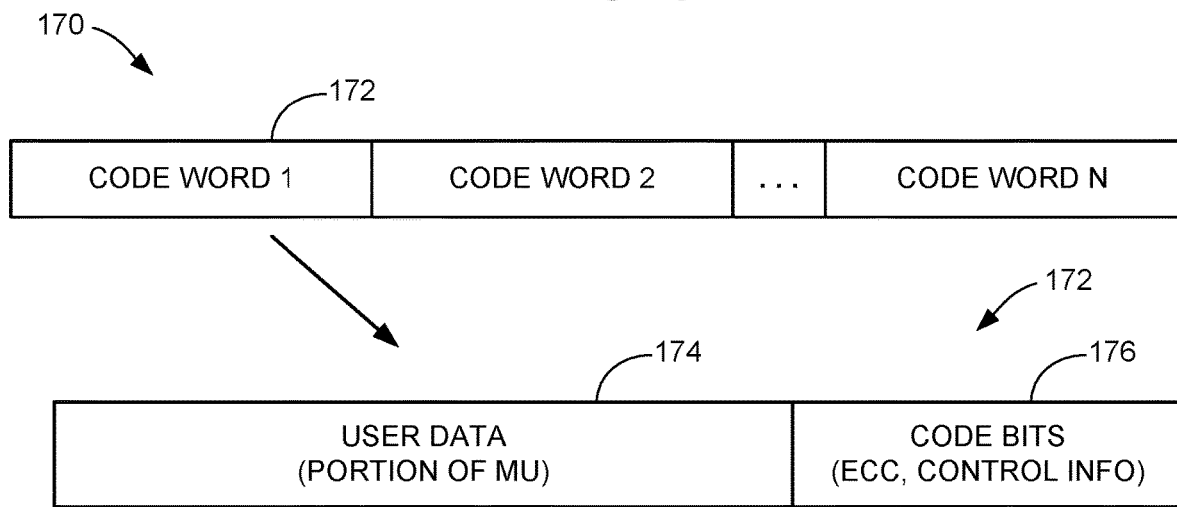
FIG. 6 shows a functional block diagram for a GCU management circuit of the SSD in accordance with some embodiments.

FIG. 6 shows a functional block diagram for a GCU management circuit 180 of the SSD 110 in accordance with some embodiments. The circuit 180 may form a portion of the controller 112 and may be realized using hardware circuitry and/or one or more programmable processor circuits with associated firmware in memory. The circuit 180 includes the use of a forward map 182 and a reverse directory 184. As noted above, the forward map and reverse directory are metadata data structures that describe the locations of the data blocks in the flash memory 142. During the servicing of host data transfer operations, as well as other operations, the respective portions of these data structures are located in the flash memory or other non-volatile memory location and copied to local memory 120 (see e.g., FIG. 2).

The forward map 182 provides a flash transition layer (FTL) to generally provide a correlation between the logical addresses of various blocks (e.g., MUAs) and the physical addresses at which the various blocks are stored (e.g., die set, die, plane, GCU, EB, page, bit offset, etc.). The contents of the forward map 182 may be stored in specially configured and designated GCUs in each die set.

The reverse directory 184 provides a physical address to logical address correlation. The reverse directory contents may be written as part of the data writing process to each GCU, such as in the form of a header or footer along with the data being written. Generally, the reverse directory provides an updated indication of how many of the data blocks (e.g., MUAs) are valid (e.g., represent the most current version of the associated data).

The circuit 180 further includes a map integrity control circuit 186. As explained below, this control circuit 186 generally operates at selected times to recall and compare, for a given GCU, the forward map data and the reverse directory data. This evaluation step includes processing to determine if both metadata structures indicate the same number and identify of the valid data blocks in the GCU.

If the respective forward map and reverse directory match, the GCU is added to a list of verified GCUs in a data structure referred to as a table of verified GCUs, or TOVG 188. The table can take any suitable form and can include a number of entries, with one entry for each GCU. Each entry can list the GCU as well as other suitable and useful information, such as but not limited to a time stamp at which the evaluation took place, the total number of valid data blocks that were determined to be present at the time of validation, a listing of the actual valid blocks, etc.

Should the control circuit 186 find a mismatch between the forward map 182 and the reverse directory 184 for a given GCU, the control circuit 186 can further operate to perform a detailed evaluation to correct the mismatch. This may include replaying other journals or other data structures to trace the history of those data blocks found to be mismatched. The level of evaluation required will depend on the extent of the mismatch between the respective metadata structures.

For example, if the forward map 182 indicates that there should be some number X valid blocks in the selected GCU, such as 12 valid blocks, but the reverse directory 184 indicates that there are only Y valid blocks, such as 11 valid blocks, and the 11 valid blocks indicated by the reverse directory 184 are indicated as valid by the forward map, then the focus can be upon the remaining one block that is valid according to the forward map but invalid according to the reverse directory. Other mismatch scenarios are envisioned.

The mismatches can arise due to a variety of factors such as incomplete writes, unexpected power surges or disruptions that prevent a full writing of the state of the system, etc. Regardless, the control circuit can expend the resources as available to proactively update the metadata. In some embodiments, an exception list 190 may be formed as a data structure in memory of GCUs that have been found to require further evaluation. In this way, the GCUs can be evaluated later at an appropriate time for resolution, after which the corrected GCUs can be placed on the verified list in the TOVG 188.

It will be noted that the foregoing operation of the control circuit 186 in evaluating GCUs does not take place once a garbage collection operation has been scheduled; instead, this is a proactive operation that is carried out prior to the scheduling of a garbage collection operation. In some cases, GCUs that are approaching the time at which a garbage collection operation may be suitable, such as after the GCU has been filled with data and/or has reached a certain aging limit, etc., may be selected for evaluation on the basis that it can be expected that a garbage collection operation may be necessary in the relatively near future.

FIG. 6 further shows the GCU management circuit 180 to include a garbage collection scheduler circuit 192. This circuit 192 generally operates once it is appropriate to consider performing a garbage collection operation, at which point the circuit 192 selects from among the available verified GCUs from the table 188. In some cases, the circuit 192 may generate a time of completion estimate to complete the garbage collection operation based on the size of the GCU, the amount of data to be relocated, etc.

As will be appreciated, a garbage collection operation can include accessing the forward map and/or reverse directory 182, 184 to identify the still valid data blocks, the reading out and temporary storage of such blocks in a local buffer memory, the writing of the blocks to a new location such as in a different GCU, the application of an erasure operation to erase each of the erasure blocks in the GCU, the updating of program/erase count metadata to indicate the most recent erasure cycle, and the placement of the reset GCU into an allocation pool awaiting subsequent allocation and use for the storage of new data sets.

Figure 7:
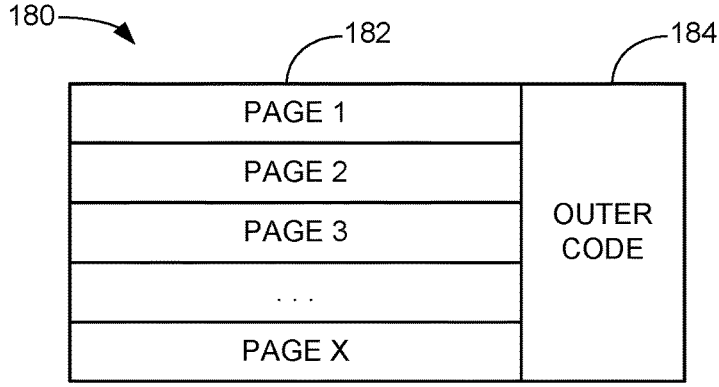
FIG. 7 illustrates an arrangement of various GCUs and corresponding tables of verified GCUs (TOVGs) for a number of different die sets in some embodiments.

FIG. 7 shows a number of die sets 200 that may be arranged across the SSD 110 in some embodiments. Each set 200 may have the same nominal data storage capacity (e.g., the same number of allocated dies, etc.), or each may have a different storage capacity. The storage capacity of each die set 200 is arranged into a number of GCUs 154 as shown. In addition, a separate TOVG (table of verified GCUs) 188 may be maintained by and in each die set 200 to show the status of the respective GCUs. From this, each time that it becomes desirable to schedule a garbage collection operation, such as to free up new available memory for a given set, the table 188 can be consulted to select a GCU that, with a high degree of probability, can be subjected to an efficient garbage collection operation without any unexpected delays due to mismatches in the metadata (forward map and reverse directory).

Figure 8:
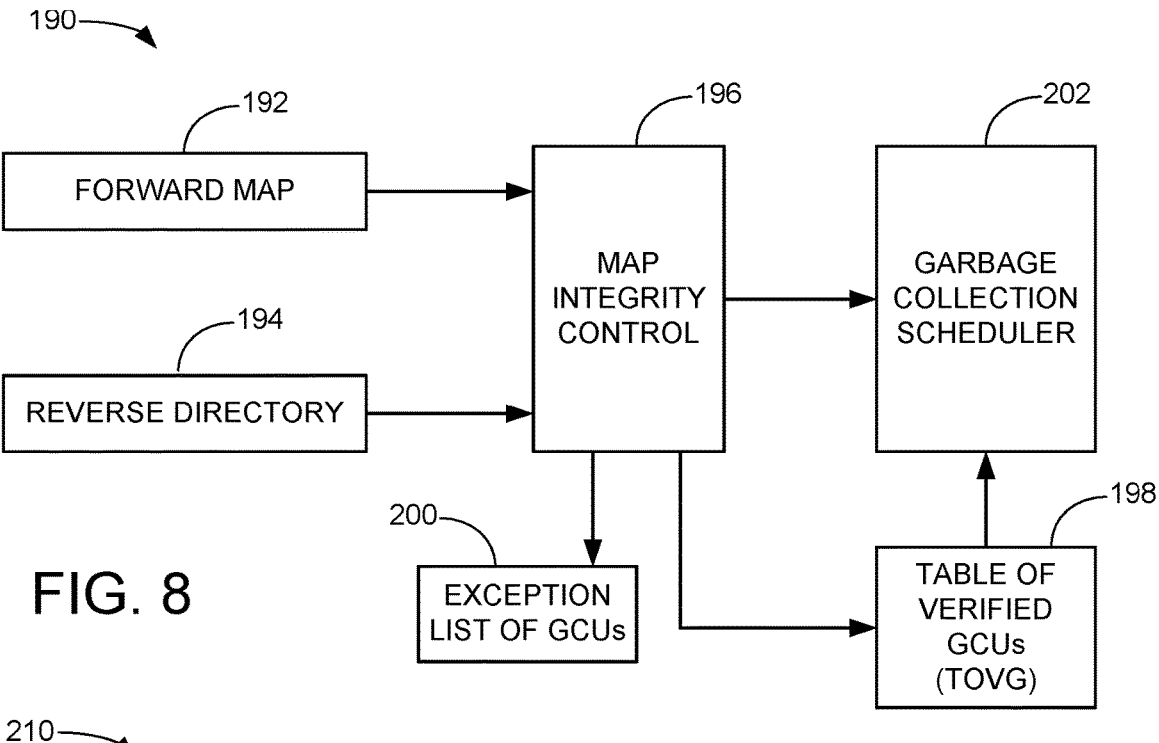
FIG. 8 displays a functional block diagram for a GCU management circuit of the SSD in accordance with some embodiments.

FIG. 8 further shows the GCU management circuit 190 to include a garbage collection scheduler circuit 202. This circuit 202 generally operates once it is appropriate to consider performing a garbage collection operation, at which point the circuit 202 selects from among the available verified GCUs from the table 198. In some cases, the circuit 202 may generate a time of completion estimate to complete the garbage collection operation based on the size of the GCU, the amount of data to be relocated, etc.

As will be appreciated, a garbage collection operation can include accessing the forward map and/or reverse directory 192, 194 to identify the still valid data blocks, the reading out and temporary storage of such blocks in a local buffer memory, the writing of the blocks to a new location such as in a different GCU, the application of an erasure operation to erase each of the erasure blocks in the GCU, the updating of program/erase count metadata to indicate the most recent erasure cycle, and the placement of the reset GCU into an allocation pool awaiting subsequent allocation and use for the storage of new data sets.

Figure 9:
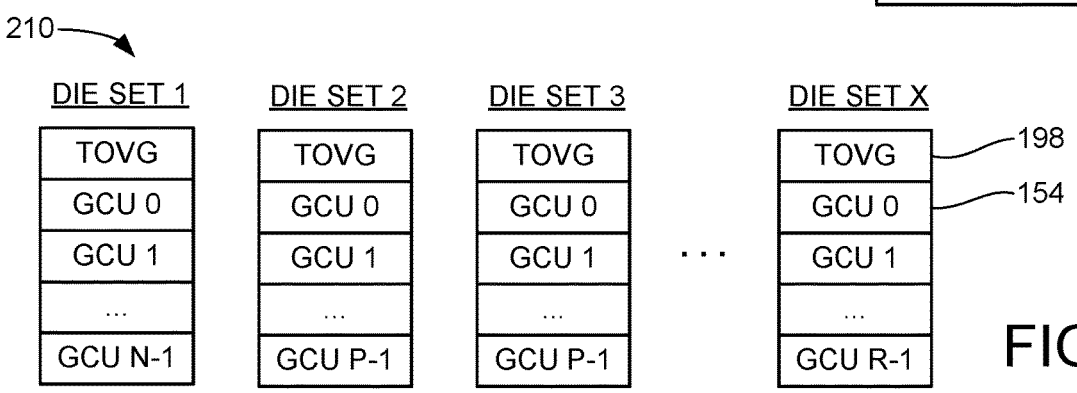
FIG. 9 depicts an arrangement of various GCUs and corresponding tables of verified GCUs (TOVGs) for a number of different die sets in some embodiments.

FIG. 9 shows a number of die sets 210 that may be arranged across the SSD 110 in some embodiments. Each set 210 may have the same nominal data storage capacity (e.g., the same number of allocated dies, etc.), or each may have a different storage capacity. The storage capacity of each die set 210 is arranged into a number of GCUs 154 as shown. In addition, a separate TOVG (table of verified GCUs) 198 may be maintained by and in each die set 210 to show the status of the respective GCUs. From this, each time that it becomes desirable to schedule a garbage collection operation, such as to free up new available memory for a given set, the table 198 can be consulted to select a GCU that, with a high degree of probability, can be subjected to an efficient garbage collection operation without any unexpected delays due to mismatches in the metadata (forward map and reverse directory).

Figure 10:
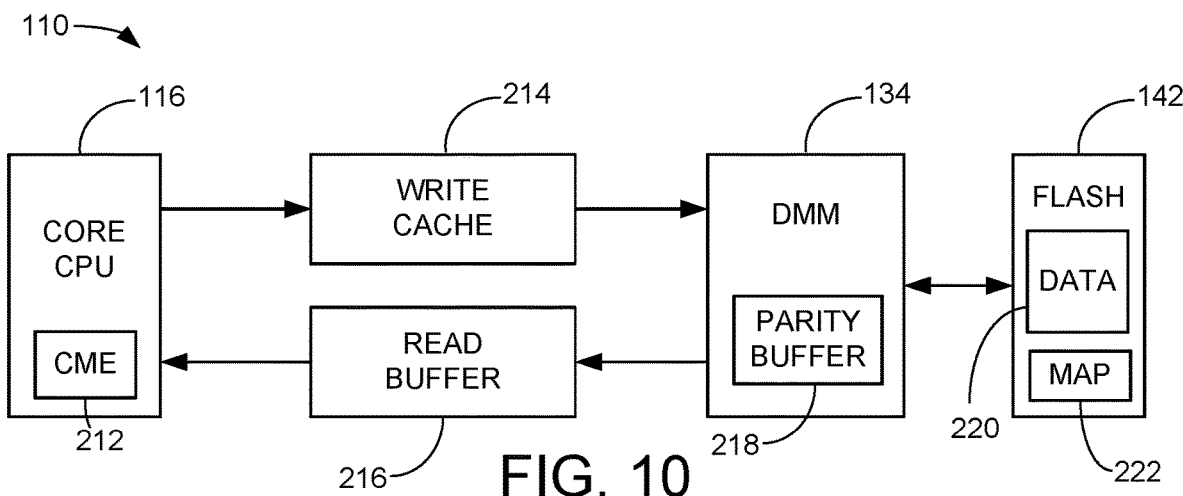
FIG. 10 illustrates an example data set that can be written to the data storage device of FIG. 1 in accordance with assorted embodiments.

FIG. 10 shows a functional block representation of additional aspects of the SSD 110. The core CPU 116 from FIG. 2 is shown in conjunction with a code management engine (CME) 212 that can be used to manage the generation of the respective code words and outer code parity values for both standard and non-standard parity data sets During write operations, input write data from the associated host are received and processed to form MUs 160 (FIG. 3) which are placed into a non-volatile write cache 214 which may be flash memory or other form(s) of non-volatile memory. The MUs are transferred to the DMM circuit 134 for writing to the flash memory 142 in the form of code words 172 as described above. During read operations, one or more pages of data are retrieved to a volatile read buffer 216 for processing prior to transfer to the host.

The CME 212 determines the appropriate inner and outer code rates for the data generated and stored to memory. In some embodiments, the DMM circuit 134 may generate both the inner and outer codes. In other embodiments, the DMM circuit 134 generates the inner codes (see e.g., LDPC circuit 146 in FIG. 2) and the core CPU 116 generates the outer code words. In still other embodiments, the same processor/controller circuit generates both forms of code words. Other arrangements can be used as well. The CME 212 establishes appropriate code rates for both types of code words.

During generation of the outer codes, a parity buffer 218 may be used to successively XOR each payload being written during each pass through the dies. Both payload data 220 and map data 222 will be stored to flash 142.

Figure 11:
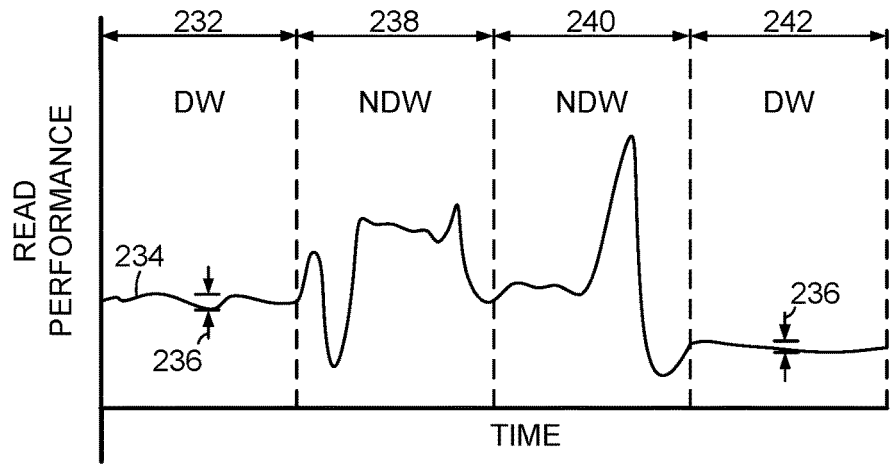
FIG. 11 plots operational data for an example data storage system employing various embodiments of the present disclosure.

FIG. 11 plots example operational data for a data storage system configured and operated in accordance with various embodiments to improve data read performance during deterministic windows. As shown, read latency is charted over time involving deterministic window (DW) and non-deterministic window (NDW) intervals. During a first DW interval 232, read latency, as indicated by solid line 234, of a plurality of reads to different portions of a memory is maintained within a relatively tight range 236, which corresponds with data read consistency over time. It is contemplated that different data read performance metrics, such as error rate and overall time to return data to a host, can be used in substitution of, or in combination to, the read latency of FIG. 11 with similarly tight ranges 236, and approximately uniform consistency, of read performance being maintained.

The tight consistency of data reads during the DW can be, at least partially, contributed to background data maintenance operations and/or data writes being reduced or suspended. A DW interval is followed by one or more NDW intervals, such as interval 238, where pending data writes and background data maintenance operations are carried out along with data reads. The inherent behavior of data writes that involve data erases prior to programming data and data maintenance operations that involve varying volumes of processing, data reads, and data writes contribute to the variance of read latency The second NDW 240 shows how data accesses and data maintenance operations are not consistent and can be considered random compared to the tight range 306 of data latency performance the DW intervals 232 and 242. It is noted that the consistent performance for the first DW interval 232 is at a different latency value than the second DW interval 242. Hence, consistency is prioritized throughout a DW interval regardless of the latency value that is consistently provided to a host, even at the expense of providing less than the fastest possible read performance. In other words, predictable read latency, and performance, are emphasized during a DW interval even if that means providing higher read latency than possible.

Figure 12:
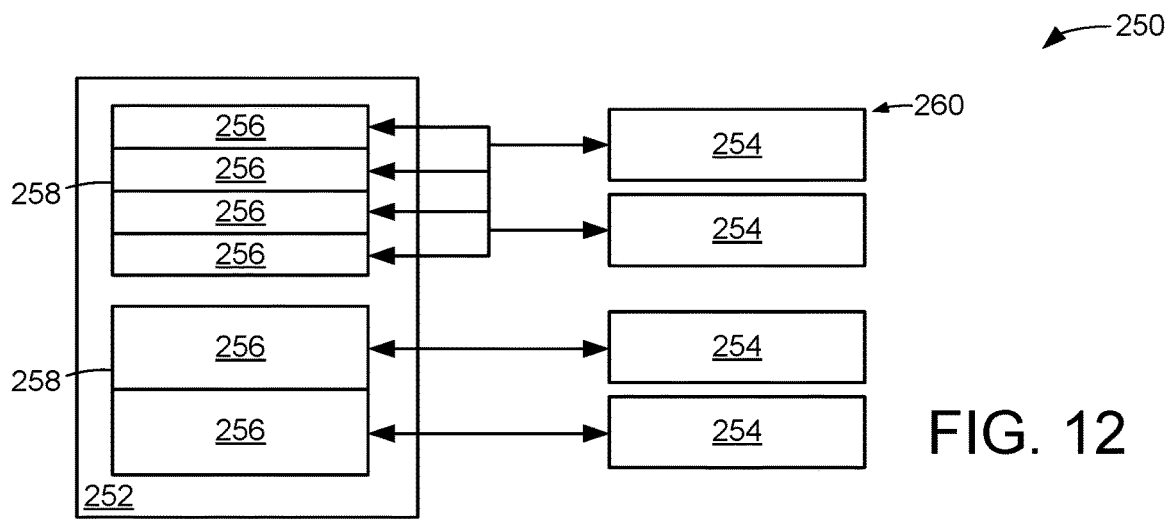
FIG. 12 conveys a block representation of an example data storage system in which various embodiments may be practiced.

FIG. 12 is a block representation of portions of an example data storage system 250 in which various embodiments may be practiced. A number of data storage devices 252 can be connected to one remote hosts 254 as part of a distributed network that generates, transfers, and stores data as requested by the respective hosts 254. It is contemplated, but not required, that each remote host 254 is assigned a single logical die set 256, which can be some, or all, of a data storage device 252 memory, such as an entire memory die 258 of a portion of a memory die, like a plane of a memory die. Regardless of the physical configuration of the die sets 256, one or more data queues can be utilized to temporarily store data, and data access commands, awaiting storage in a die set 256 or awaiting delivery from a die set 256.

In the non-limiting die set/host configuration shown in FIG. 12 where a single die set 256 is assigned to a single host 254, data access operations, such as data reads, data writes, and background activity like garbage collection and memory cell refreshes, can efficiently occur as scheduled. In the event errors, faults, conflicts, or diminished data capacity occur, a single host 254 is affected and data access performance can be restored relatively quickly and simply. However, when multiple hosts 254 are each connected to a single die set 256, as illustrated in die set/host configuration 260, conditions that degrade data access performance, such as errors, faults, and reduced data capacity, have a larger and longer impact on data storage system 250 operation due, at least in part, to increased complexity of data access commands and data delivery.

Figure 13:
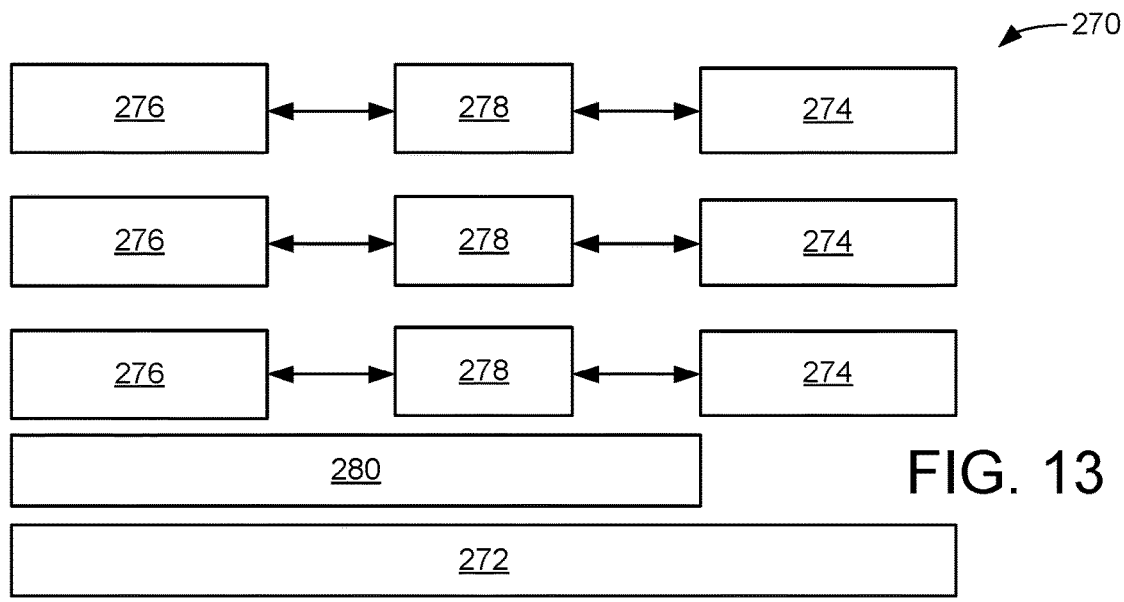
FIG. 13 represents portions of an example data storage system configured in accordance with various embodiments.

In FIG. 13, an example data storage system 270 is displayed that illustrates how increased scale distributed data storage networks make quality of service difficult. The data storage system 270 has at least one local controller 272 that organizes, activates, and monitors data accesses between a plurality of different remote hosts 274 and different logical die sets 276. It is noted that any number of data queues 278 can be logically positioned between the hosts 274 and die sets 276, without limitation. It is further noted that the assorted die sets 276 can be arranged alone, or in combination with other die sets 276, in a memory die of a data storage device.

Through nominal operation of the data storage system 270 and despite proper execution of data access commands and background operations, write amplification can occur where the actual amount of data written to a die set 276 is greater than the amount requested by a host 274. Write amplification can be exacerbated by loss of data capacity and/or overprovisioned portions of a die set 276, such as through failures, errors, or other memory occupying activity. It is contemplated that one or more buffers 280 can be utilized for temporary data storage while portions of a die set 276 are repaired to overcome write amplification, but such practice can be relatively slow and occupy precious processing capabilities that may degrade overall data access performance for the data storage system 270.

Hence, through satisfactory execution of data access operations, a data storage system 270 can experience errors, faults, conflicts, and write amplification that temporarily, or permanently, degrade system 270 performance. While the local controller 272 can be configured to manage and resolve conditions and situations that degrade system 270 performance, such resolution can result in dissimilar data access performance characteristics being experienced by the respective hosts 274. The advent of high data access frequency hosts has emphasized consistent and nominally even data access performance across different die sets 276 and hosts 274 throughout the data storage system 270. Accordingly, various embodiments are directed to providing increasingly uniform data access performance for a data storage system 270 regardless of the events that alter and/or degrade data access performance between a die set 276 and a host 274.

Figure 14:
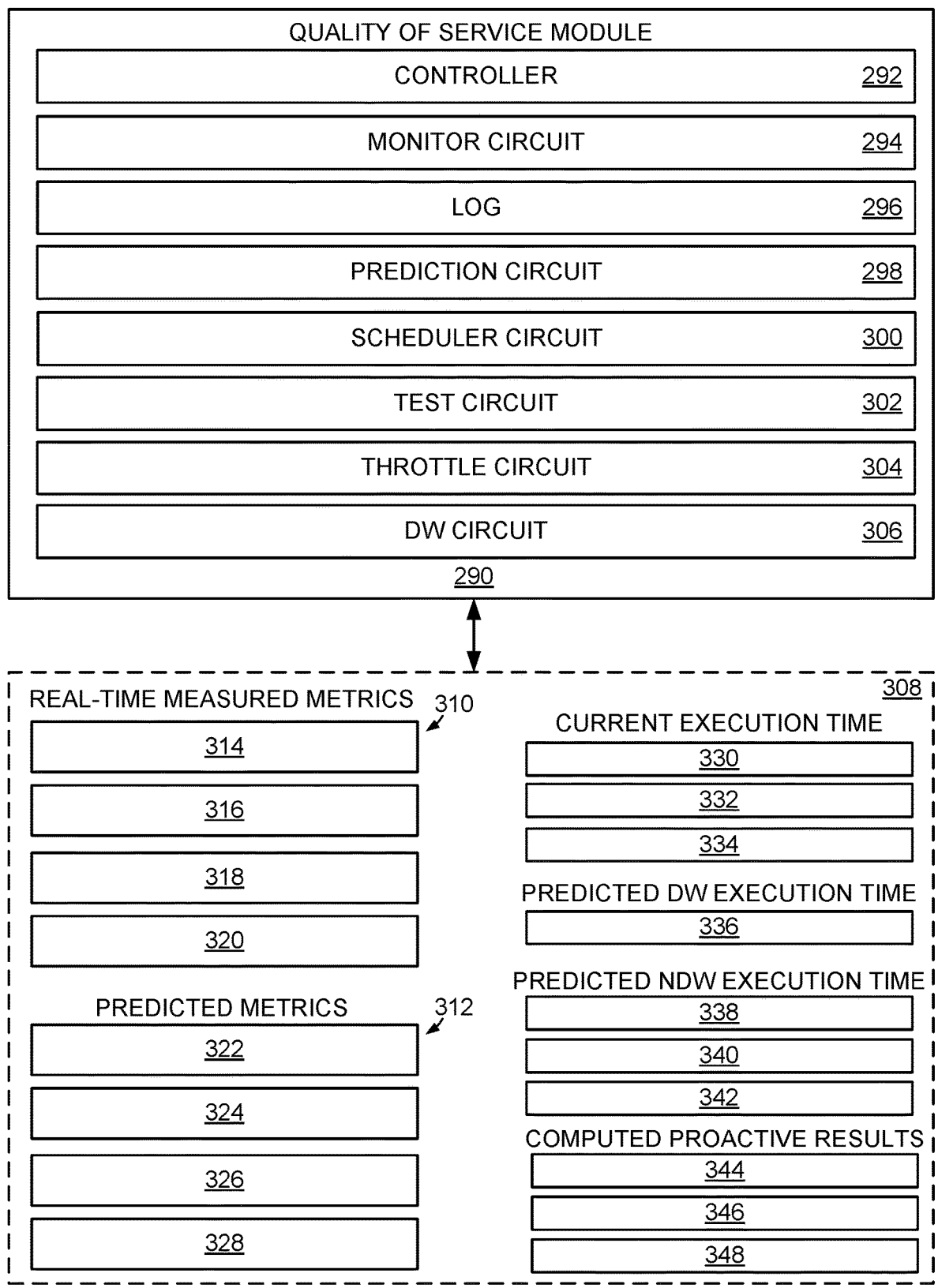
FIG. 14 shows an example quality of service module capable of being used in a data storage system in accordance with some embodiments.

FIG. 14 depict a block representation of an example quality of service module 290 configured and operated in accordance with some embodiments to balance data access performance across different die sets and hosts. The quality of service module 290 can intelligently utilize constituent circuitry to track performance metrics of executed tasks between multiple different die sets and hosts in a distributed data storage system to reactively and proactively optimize data access requests to concurrently balance data access performance across the system.

The quality of service module 290 can utilize a controller 292, such as a microprocessor or programmable circuitry generally represented by controller 272 of FIG. 13, to direct activity of various circuitry. For instance, real-time data storage system performance metrics, such as latency, error rate, overall time to service a host request, number of background operations triggered, overall queue input-output frequency, and deterministic window interval activation, can be measured and/or detected with a monitor circuit 294. The monitor circuit 294 may maintain a log 296 of detected die set and host activity in local memory in order to allow a prediction circuit 298 of the module 290 to identify patterns and consequential data access tasks.

The prediction circuit 298 can utilize model data from other data storage systems and/or past logged activity from the present system to predict what tasks are likely to arrive in a die set queue as well as how long each task will take to execute in various die sets of a distributed data storage system in view of the present system conditions. The prediction circuit 298 can employ machine learning to improve the accuracy of forecasted background operations, read accesses, and write accessed, as well as the performance of those forecasted tasks, based on real-time tracked executions from the monitor circuit 294. It is contemplated the prediction circuit 298 can generate an accuracy value for forecasted tasks, and/or forecasted performance, and only provide those predictions that are above a predetermined accuracy threshold, such as 90% confidence.

The ability to predict future tasks and their respective execution times to numerous different die sets with the prediction circuit 298 allows the quality of service module 290 to organize existing tasks so that future tasks do not inhibit or degrade consistent read access latency during deterministic window intervals. Knowledge of past executed tasks to a die set attained with the monitor circuit 294 and the accurate prediction of future pending tasks and their execution times allows a scheduler circuit 300 of the module 290 to customize existing queued tasks to at least one die set to optimize future data storage system operation. Queue customization is not limited to a particular action, but is contemplated that the scheduler circuit 300 correlates certain tasks to available system processing bandwidth, prioritizes the longest tasks to execute, prioritizes the shortest tasks to execute, and/or generates background operations out-of-turn.

At any time, the quality of service module 290 can utilize a test circuit 302 to carry out one or more data access operations to at least one portion of any die set to collect operational data that can increase the accuracy and speed of the monitor 294 and prediction 298 circuits. That is, one or more test patterns of data reads and/or data writes can be conducted to one or more different die sets with the test circuit 300 to verify measurements by the monitor circuit 294, test for un-monitored performance characteristics, such as memory cell settling, write amplification, or environmental conditions, and measure the data access performance of less than all of a die set.

As a result of real-time measurements, predictions, or tests, the execution performance of queued tasks may be higher, or lower, than expected. A throttle circuit 304 can resolve such issues by altering a queued task to manipulate the task's execution performance. For instance, the throttle circuit 304 may split a task into two separately executed tasks, utilize less than all available system resources to execute a task, or deliberately delay a task during execution to control when a task completes. Such control of queued task execution performance can be particularly emphasized during DW intervals. Accordingly, the quality of service module 290 has a DW circuit 306 that can operate alone, and other circuits, to choose and/or manipulate pending die set tasks to ensure consistent data access performance for each die set and host of a data storage system throughout the guaranteed interval time period.

Some embodiments contemplate a single quality of service module 290 handling a variety of different die sets, queues, and host commands while other embodiments may use multiple different quality of service modules 290 in a data storage system. Regardless of the number of quality of service modules 290, or constituent circuitry, a data storage system controller may compile measured and/or predicted system information together in order to generate a strategy for establishing and maintaining balanced data access performance for each die set and host. Such compiled information is conveyed in FIG. 14 as a dashboard 308. It is noted that the dashboard 308 is merely exemplary and in no way limits the possible information compiled by a data storage system controller.

The example dashboard 308 has several different real-time metrics 310 measured by at least one monitor circuit 294 and several different predicted metrics 312 forecasted by at least one prediction circuit 298. The real-time metrics 310 may be average latency 314 (read and/or write), error rate 316, read-write ratio 318, and I/O frequency 320 while the predicted metrics 312 may be read time to host 322, write request completion time 324, number of future background operations 326, and average read latency 328. Other real-time 310 and/or predicted 312 metrics can be computed by a system controller that are displayed, or not displayed, on the dashboard 308.

Regardless of whether computed metrics are shown on the dashboard 308, the metrics allow for real-time operational information to be calculated and displayed. For instance, real-time execution times for read requests 330, write requests 332, and background operations 334 can represent current, measured access to some, or all, of a data storage system. The displayed execution times 330/332/334 may be statistics for a single data access operation or an average of multiple accesses, such as the immediate past ten data reads, data writes, or background operations.

The computation of real-time 310 and predicted 312 metrics allows a prediction circuit to forecast the execution time in various hypothetical system conditions. As a non-limiting example, a controller can compute a single, or average, read access request execution time 336 while in DW interval conditions and single, or average, execution times to complete a read 338, write 340, or background operation 342 during NDW interval conditions.

The various predicted DW and NDW data access execution times can allow a scheduler circuit to intelligently choose which queued data access operations to execute in order to prepare a die set for more consistent DW interval performance. Such execution selection may involve reorganizing queued data access commands or changing the queue execution order without rewriting the queue. The ability to predict execution times for data accesses based on actual, detected operations to a die set allows the dashboard to be highly accurate and precise, which corresponds with optimized deterministic I/O for one or more die sets of a data storage system.

With the real-time and predicted metrics and computations for each die set and host of a data storage system, various embodiments utilize the quality of service module 290 to generate and test a plurality of different hypothetical future data access scenarios in an effort to develop one or more proactive strategies for preventing deviation from a nominally consistent data access performance for each die set and host. For instance, a scheduler circuit can input computed max data access execution time 344, minimum data access execution time 346, and risk of deviation over time based on write amplification, errors, and conflicts 348 to proactively modify one or more die set queues and pending data access requests to prevent a predicted event, such as a loss of data capacity in at least one die set, and maintain nominally consistent data access performance throughout the data storage system.

The predicted events and proactive modifications can be complex, particularly when some die sets are in a DW interval while other intervals are in NDW intervals. Hence, the quality of service module 290 may continually operate to provide multiple different proactive data access modification strategies that can be selected depending on the DW/NDW configuration of the various die sets and hosts of a data storage system. That is, the quality of service module 290 can generate multiple different predicted system events that depend on the number, frequency, and length of DW intervals requested by the hosts of the data storage system.

Figure 15:
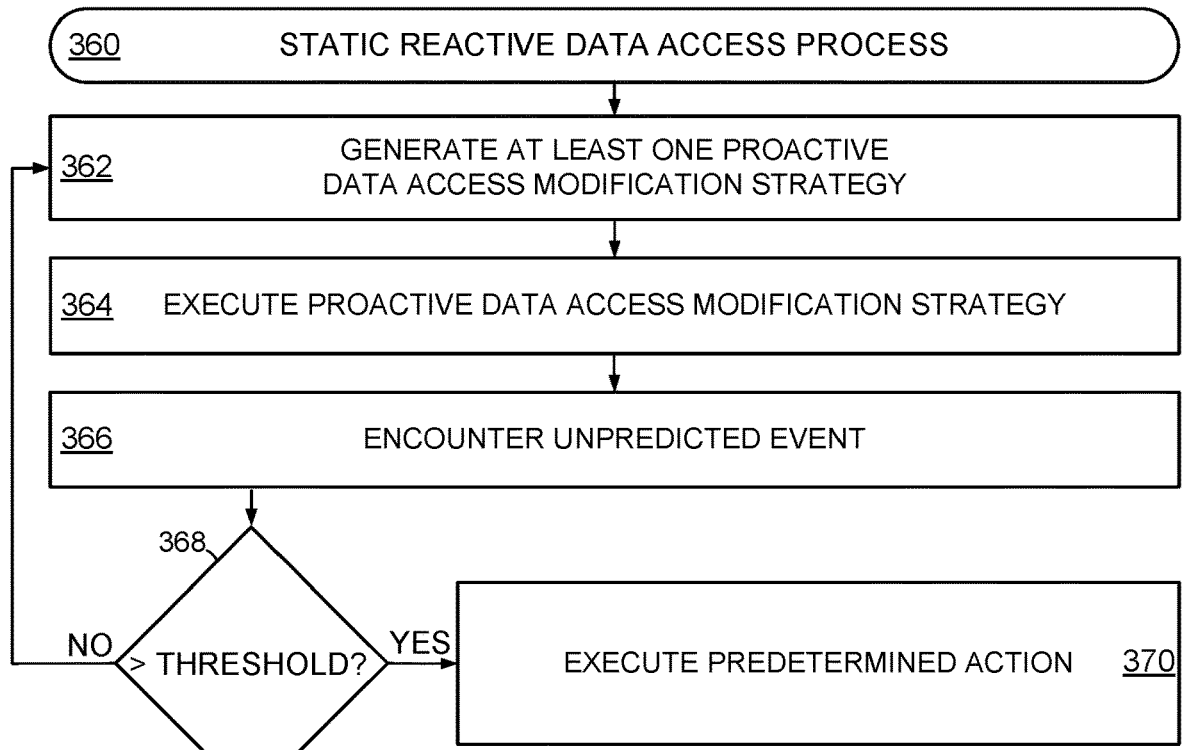
FIG. 15 is a flowchart of an example data access process that can be conducted in a data storage system in accordance with assorted embodiments.

It is contemplated that the proactive modifications can be combined with a reactive data access request modification strategy to optimize data access performance balancing in response to changing die set, host, and system resource conditions. FIG. 15 conveys a static reactive data access process 360 that can be carried out by the quality of service module 290 in a distributed data storage system 270 in accordance with some embodiments. The process 360 can begin with the generation of at least one proactive data access modification strategy in step 362 that is at least partially executed in step 364 before an unpredicted system condition is encountered in step 366. Such unpredicted condition may be a memory cell, die set, die, or data storage device failure that necessitates additional system resources, such as power, buffer usage, processing power, or other available resource, to maintain existing data access performance.

The quality of service module can establish one or more thresholds that correspond with how drastic the unpredicted condition will be to resolve. For example, a threshold may be actions that are predicted to be needed to return to a nominally consistent die set/host data access performance for the system, such as an amount of time, a percentage of available system resources, and/or a likelihood of returning to prior data access performance levels. Decision 368 evaluates the established thresholds compared to the predicted results of the unpredicted condition(s).

If the necessary remedial actions are above the predetermined threshold, step 370 is triggered to conduct a predetermined action to mitigate the severity of non-uniformity amongst the various system die set data access performance. The predetermined action of step 370 is not limited to a particular routine, but can involve diverting pending data access commands of a problematic die set to a system buffer where the destination of the various data accesses are rebalanced among the other die sets of the system. Other aspects of step 370 may be executing only read access requests while a problematic die set is repaired and/or pending data writes are reassigned by a scheduler circuit to other die sets of the system.

Figure 16:
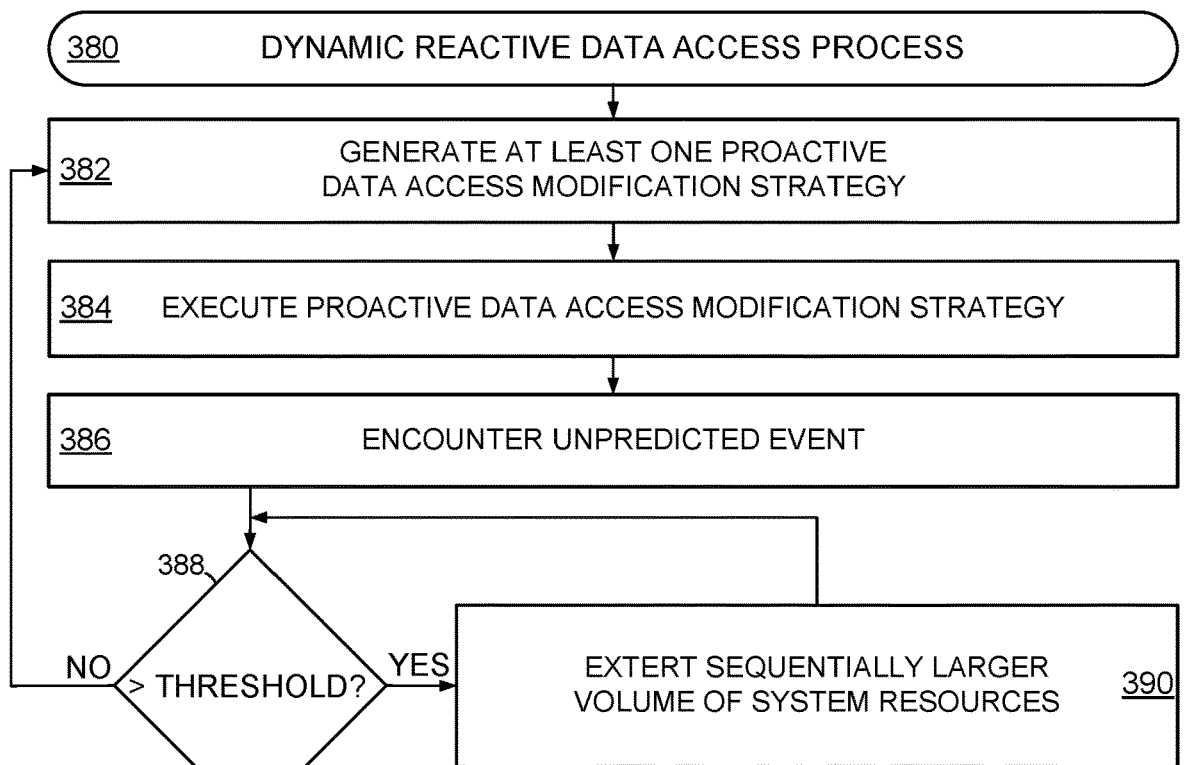
FIG. 16 is a flowchart of an example data access process capable of being utilized in a data storage system in accordance with various embodiments.

The use of a predetermined, static response to encountered unpredicted events that can degrade data access performance uniformity allows for quick reaction that can mitigate the effect of the unpredicted event. However, the use of one or more static responses may exert too much, or too little, system resources to prevent data access performance uniformity degradation. Thus, some embodiments utilize a dynamic approach to reactively handling unpredicted events. FIG. 16 depicts an example dynamic reactive data access process 380 that can be carried out by the quality of service module 290 in a distributed data storage system 270. In a manner similar to process 360, steps 382, 384, and 386 generate a proactive strategy, execute the strategy, and subsequently encounter one or more unpredicted events.

Decision 388 evaluates the severity of the unpredicted event, much like decision 368, but process 380 responds to an unpredicted event with a relatively small exertion of system resources in step 390 before returning to decision 388. For instance, step 390 may simply slow the execution of data access commands to a problematic die set in order to give a system controller time to rebalance and/or repair the unpredicted event. As another example, step 388 may buffer less than all of the pending data access requests from a queue to minimize the redirection of access requests.

Once decision 388 is revisited, the unpredicted event is reconsidered with the new data access request modifications of step 390. If the unpredicted event remains severe enough to breach one or more thresholds, step 390 is activated again with an increased amount/volume of system resources being utilized to mitigate, and/or repair, the existing unpredicted event. By cycling through decision 388 and step 390 with increasingly greater volumes of system resources, no more resources than necessary are exerted to solve the unpredicted event's impact on data access performance uniformity. In yet, the cycling of decision 388 and step 390 may take more overall time, and potentially processing resources, than the static response of step 370. Therefore, a quality of service module can intelligently select to employ one, or both, of the processes 360/380 to handle unpredicted events and maintain consistent data access performance throughout the assorted die sets to corresponding hosts.

Figure 17:
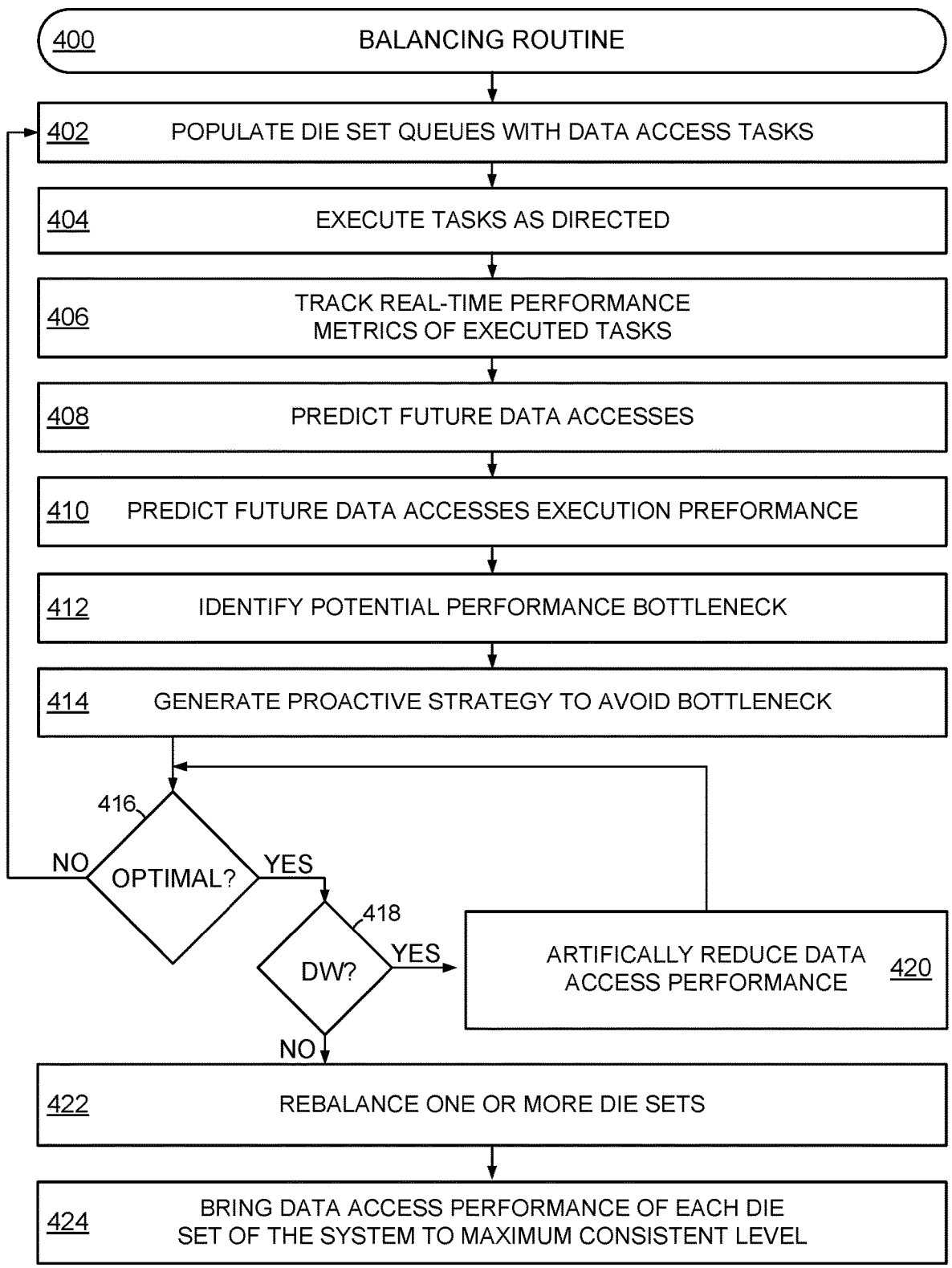
FIG. 17 is an example balancing routine that can be carried out with the respective embodiments of FIGS. 1-16.

FIG. 17 is a flowchart of an example balancing routine 400 that can be employed in a data storage system by a quality of service module in accordance with various embodiments. Initially, step 402 populates die set queues with data access tasks to be performed in step 404. It is noted that step 404 can execute tasks concurrently, and/or sequentially, in some, or all, of the die sets of a data storage system. Step 406 tracks the real-time performance of the various data access task executions to compile system metrics that can be useful to a prediction circuit to predict future data accesses that are likely to enter the assorted system queues in step 408 and predict future data access execution performance in step 410.

The combination of real-time and predicted data access performance metrics allows a quality of service module to identify a potential performance bottleneck in step 412 and generate at least one proactive strategies in step 414 to avoid the predicted bottleneck. Step 414 may execute one or more proactive data access modifications, such as altering data access destinations, data access storage locations, data access order in a queue, or execution time. It is contemplated that the proactive data access modification can be conducted on any die set and/or queue of a system, which may, or may not, be the die set/queue where the performance bottleneck is predicted. For instance, step 414 can throttle the data access performance of each die set unaffected by the predicted bottleneck to a performance level that is less than the capabilities of the respective die sets in order to maintain a nominal consistency of data access performance throughout the data storage system.

Regardless of the proactive activities of step 414, decision 416 evaluates if current system quality of service, such as data access latency, error rate, and overall execution time, is adequately consistent for each die set of the system. If the system is properly consistent, the routine 400 returns to step 402 where new data access are queued and subsequently executed. If the real-time quality of service is not consistent enough, decision 416 prompts decision 418 to evaluate what, if any, die sets are in a DW interval. The presence of a DW interval can disrupt potential die set consistency resolution strategies generated by the quality of service module.

A DW interval is met with step 420 artificially reducing the data access performance of some die sets so that the entire data storage system experiences the same data access performance as the die set(s) in the DW interval. Once the DW interval is over, step 422 proceeds to rebalance or otherwise modify one or more die set queues to resolve the situation(s) that resulted in the inconsistent quality of service in decision 416. As a result of step 422, step 424 is able to bring the data access performance of each of the die sets of the system up to an unthrottled maximum consistent level.

In the event no die set is in a DW interval in decision 418, step 422 rebalances one or more die set queues as quickly as possible so that consistent quality of service returns before a DW interval is requested from a host. That is, step 422 sacrifices short-term system consistency to ensure the system can service a DW interval request and provide long-term data access performance uniformity.

It is noted that while various embodiments are directed to semiconductor memory, such as NAND flash, it is contemplated that the data access management provided by a quality of service module can be utilized in non-semiconductor data storage, such as tape and rotating magnetic media.

Through the various embodiments of a data storage system, a plurality of logical die sets can be optimized with a quality of service module tracking data access execution performance metrics. The utilization of the tracked execution performance metrics to predict future read, write, and background operation execution performance allows the resource module to intelligently choose and execute pending die set access commands out of queued order to optimize current and/or future performance. The ability to employ current command execution performance to predict both DW and NDW interval performance allows for current command execution that results in future performance improvements.

What is claimed is:

1. A method comprising:
   measuring performance metrics of execution of a first data access command to a first die set of a semiconductor memory and of a second data access command to a second die set of the semiconductor memory;
   generating a proactive strategy to maintain consistent data access command execution latency within a range for each of the first die set and the second die set during a deterministic window for the first die set or the second die set with the quality of service module based on the measured performance metrics;
   altering a third data access command as directed by the proactive strategy to prevent a predicted non-uniformity of data access command execution latency outside the range in the first die set and in the second die set during the deterministic window;
   predicting, with the quality of service module, a first data access command execution latency consistency in the first die set being different than a second data access command execution latency consistency in the second die set; and
   rebalancing the first die set and second die set by moving at least one pending data access command in accordance with proactive strategy to reduce a difference between the first data access command execution latency consistency and the second data access command execution latency consistency.

2. The method of claim 1, wherein the first data access command comprises at least one data read, at least one data write, and at least one background operation.

3. The method of claim 1, wherein the third data access command is altered prior to a predicted event that contributes to the non-uniformity of data access command execution latency.

4. The method of claim 1, wherein the quality of service module predicts at least one performance bottleneck that contributes to the non-uniformity of data access command execution latency.

5. The method of claim 1, wherein a prediction circuit of the quality of service module predicts at least one future data access command to the first die set.

6. The method of claim 5, wherein the prediction circuit predicts a data access performance metric for the at least one future data access command.

7. The method of claim 1, wherein the alteration of the third data access command is executed during a non-deterministic window interval.

8. The method of claim 1, wherein a throttle circuit of the quality of service module artificially delays execution of at least one data access command to provide uniformity in data access command execution for the first and second die sets.

9. The method of claim 1, wherein the first data access command execution latency and the second data access command execution latency are each artificially reduced during the deterministic window as directed by the proactive strategy.

10. A method comprising:
    measuring performance metrics of execution of a first data access command to a first die set of a data storage and of a second data access command to a second die set of the data storage;
    testing at least the first die set for memory cell settling with a test pattern generated by a quality of service module
    generating a proactive strategy to maintain consistent data access command execution latency within a range for the first die set and the second die set with the quality of service module based on the measured performance metrics and tested memory cell settling;
    generating a reactive strategy to maintain consistent data access command execution latency within the range with the quality of service module based on detection of an unpredicted event;
    altering a third data access command as directed by the proactive strategy to prevent a predicted non-uniformity of data access command execution latency outside the range in the first die set and in the second die set;
    predicting, with the quality of service module, a first data access command execution latency consistency in the first die set being different than a second data access command execution latency consistency in the second die set; and
    rebalancing the first die set and second die set by moving at least one pending data access command in accordance with proactive strategy to reduce a difference between the first data access command execution latency consistency and the second data access command execution latency consistency.

11. The method of claim 10, wherein a prediction circuit of the quality of service module predicts a loss of data capacity in the first die set.

12. The method of claim 10, wherein the reactive strategy involves execution of a predetermined reaction to any unpredicted event.

13. The method of claim 10, wherein the reactive strategy involves a dynamic and gradual increase in system resource exertion.

14. The method of claim 10, wherein the unpredicted event is a failure of a portion of the data storage.

15. The method of claim 10, wherein a plurality of pending data access commands is rebalanced by the quality of service module as directed by the proactive strategy.

16. The method of claim 10, wherein a plurality of pending data access commands is rebalanced by the quality of service module as directed by the reactive strategy.

17. The method of claim 10, wherein the consistent data access command execution latency maintained by the quality of service module is more than the execution latency performance capability for at least one die set.

18. The method of claim 10, wherein the quality of service module computes multiple different proactive strategies to adapt to changing data storage conditions.

19. A system comprising a quality of service module connected to a first die set and a second die set of a semiconductor memory, the quality of service module configured to measure performance metrics of execution of a first data access command to the first die set and of a second data access command to a second die set, a prediction circuit of the quality of service module generates and executes a proactive strategy to maintain consistent data access command execution latency within a range by proactively rebalancing the first die set and second die set by moving at least one pending data access command to reduce a difference between a first predicted data access command execution latency consistency in the first die set and a second predicted data access command execution latency consistency in the second die set with a quality of service module based on the measured performance metrics and in response to the first predicted data access command execution latency consistency being different than the second predicted data access command execution latency consistency, a scheduler circuit of the quality of service module is configured to alter a third data access command as directed by the proactive strategy to prevent a predicted non-uniformity of data access command performance outside the range between the first die set and the second die set.

20. The system of claim 19, wherein the quality of service module compiles measured and predicted data access command performance metrics to test how different proactive strategies impact the consistency of data access command execution performance.

* * * * *